(12) United States Patent
Chow et al.

(10) Patent No.: US 7,410,821 B2
(45) Date of Patent: Aug. 12, 2008

(54) METHOD OF FABRICATING SUSPENDED STRUCTURE

(75) Inventors: Yao-Tian Chow, Tai-Chung Hsien (TW); Pin-Ting Liu, Kao-Hsiung Hsien (TW)

(73) Assignee: Touch Micro-System Technology Inc., Yang-Mei, Taoyuan Hsien (TW)

( * ) Notice: Subject to any disclaimer, the term of this patent is extended or adjusted under 35 U.S.C. 154(b) by 378 days.

(21) Appl. No.: 11/277,150

(22) Filed: Mar. 22, 2006

(65) Prior Publication Data

US 2007/0105385 A1 May 10, 2007

(30) Foreign Application Priority Data

Nov. 8, 2005 (TW) .............................. 94139127 A

(51) Int. Cl.
*H01L 21/00* (2006.01)

(52) U.S. Cl. ........................................ 438/53; 438/689

(58) Field of Classification Search ................... 438/53, 438/689, 704, 745, 751
See application file for complete search history.

(56) References Cited

U.S. PATENT DOCUMENTS 6,816,301 B1* 11/2004 Schiller ...................... 359/290

\* cited by examiner

*Primary Examiner*—David Vu
(74) *Attorney, Agent, or Firm*—Winston Hsu

(57) ABSTRACT

A substrate having a sacrificial layer and a structural layer disposed on the front surface of the substrate is provided. Thereon an opening is formed on the back surface of the substrate and the sacrificial layer is exposed partially. A wet etching process is performed to etch the sacrificial layer via the opening to form a suspended structure. Finally, a gas injection process is performed. The gas injection process comprises blowing a gas on the suspended structure via the opening and consequently preventing the suspended structure from sticking to the substrate.

9 Claims, 5 Drawing Sheets

METHOD OF FABRICATING SUSPENDED STRUCTURE

BACKGROUND OF THE INVENTION

1. Field of the Invention

The invention relates to a method of fabricating a suspended structure, and more particularly to a method using a gas injection process on a structural layer to prevent the structural layer from sticking to a substrate after removing a sacrificial layer.

2. Description of the Prior Art

Micro-electromechanical systems (MEMS) are modern technology, which coordinate electrical circuits and mechanics. MEMS have been applied to fabricate devices with both electrical circuits and mechanical elements, such as pressure sensors, accelerators, and micro-microphones. Compared to semiconductor devices, MEMS devices usually have a suspended structure, for instance, a diaphragm. While fabricating a MEMS device, a sacrificial layer is formed before a structural layer, which is going to be the structure of the device. Afterward, the pattern of the structural layer is defined, and then the sacrificial layer is removed to form a suspended structure.

In general, the material of the sacrificial layer is silica, and the material of the structural layer is silicon. There are two major methods of removing the sacrificial layer: dry etching and wet etching. Dry etching uses a gas-phase material, such as a fluorine-included gas, to remove the sacrificial layer and to form the suspended structure. However, dry etching costs much process time. Contrary to dry etching, wet etching uses a liquid, such as a hydrofluoric acid (HF) solution, to remove the sacrificial layer and to form the suspended structure. Wet etching costs less process time. Nevertheless, the suspended structure may collapse easily owing to the surface tension of the cleaning solution and stick to the substrate during the following cleaning process.

Please refer to FIG. 1 and FIG. 2. FIG. 1 and FIG. 2 illustrate a conventional method of removing the sacrificial layer by wet etching. As shown in FIG. 1, a substrate 10 is provided. The substrate 10 comprises a sacrificial layer 12 with a defined pattern, and a structural layer 14 on the front surface of the substrate 10. Afterward, an opening 16 is formed on the back surface of the substrate 10. As shown in FIG. 2, a wet etching process is performed to etch the sacrificial layer 12 via the opening 16 by an etching solution and to form a suspended structure 18. Then, a cleaning process is performed immediately. The suspended structure 18 is a fine structure and is able to shift vertically in a proper range. However, according to the conventional method of removing the sacrificial layer 12 by wet etching, the suspended structure 18 may collapse owing to the surface tension of the cleaning solution and stick to the substrate 10. These may result in device damage and affect the yield of fabrication seriously.

SUMMARY OF THE INVENTION

It is therefore a primary objective of the claimed invention to provide a method of fabricating a suspended structure to improve the yield of fabrication.

According to the claimed invention, a method of fabricating a suspended structure is disclosed. At first, a substrate is provided. The substrate comprises a sacrificial layer and a structural layer on the surface of the substrate. Then, an opening is formed on the back surface of the substrate and the sacrificial layer is exposed. After that, a wet etching process is performed to etch the sacrificial layer via the opening to form a suspended structure from the structural layer. Eventually, a gas injection process is performed, which comprises blowing a gas on the suspended structure via the opening and consequently preventing the suspended structure from sticking to the substrate.

According to the claimed invention, the invention further provides a method of fabricating a suspended structure. At first, a substrate having a sacrificial layer and a structural layer on the surface of the substrate is provided. Then, a wet etching process is performed to etch the sacrificial layer to form a suspended structure from the structural layer. After that, a wet cleaning process is performed using a cleaning solution to clean the substrate and the suspended structure. Lastly, a gas injection process is performed to blow a gas on the suspended structure and consequently prevent the suspended structure from sticking to the substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
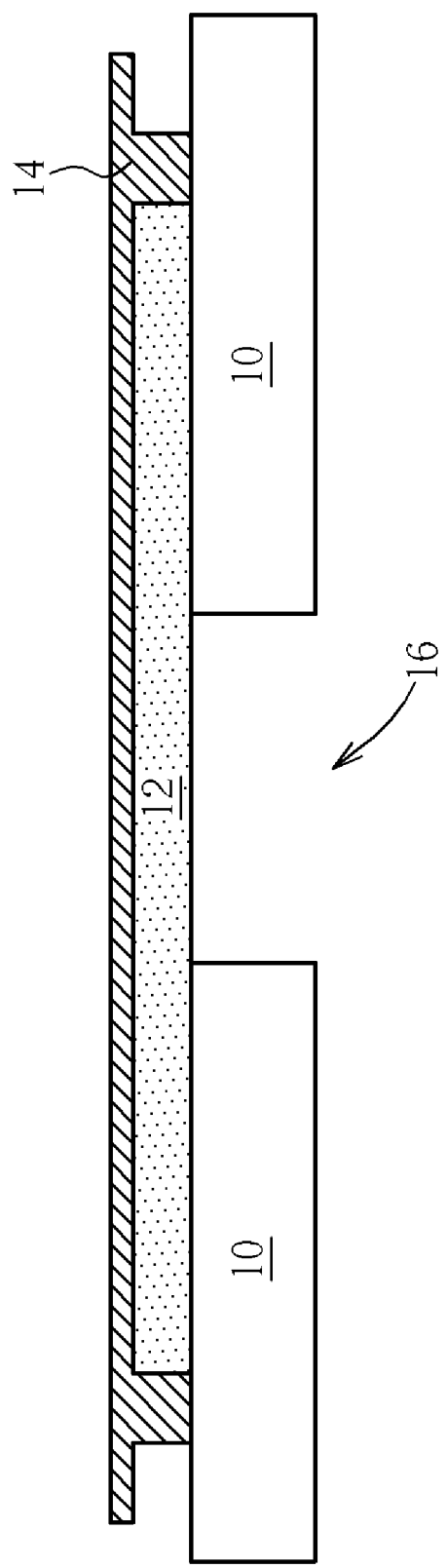
FIG. 1 and FIG. 2 illustrate a conventional method of removing the sacrificial layer by wet etching.
Figure 2:
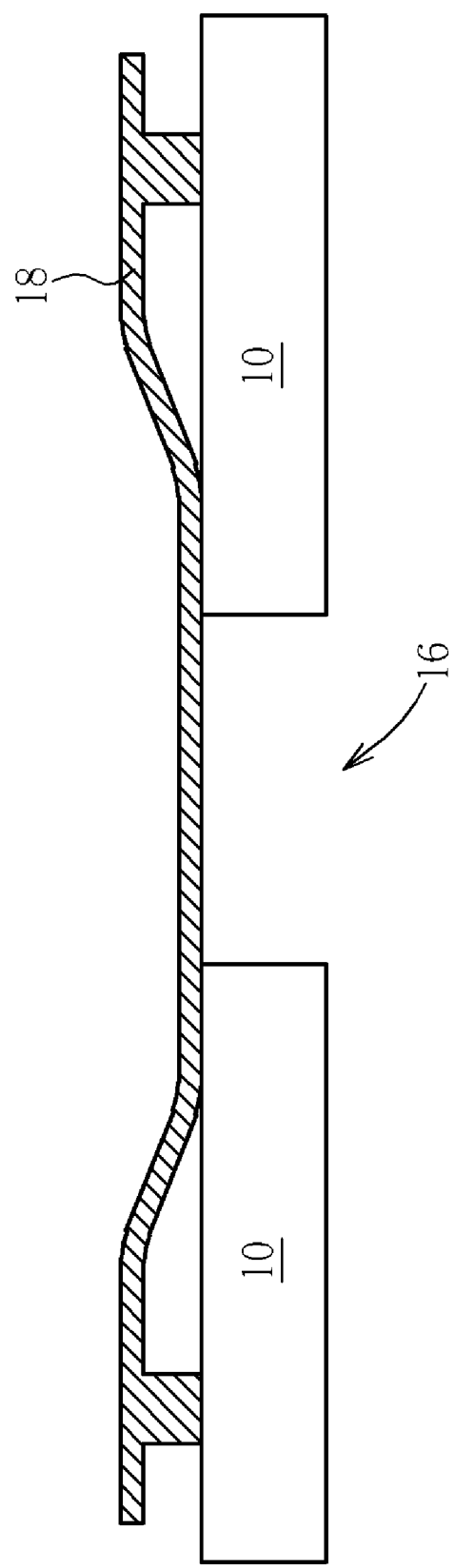
Figure 3:
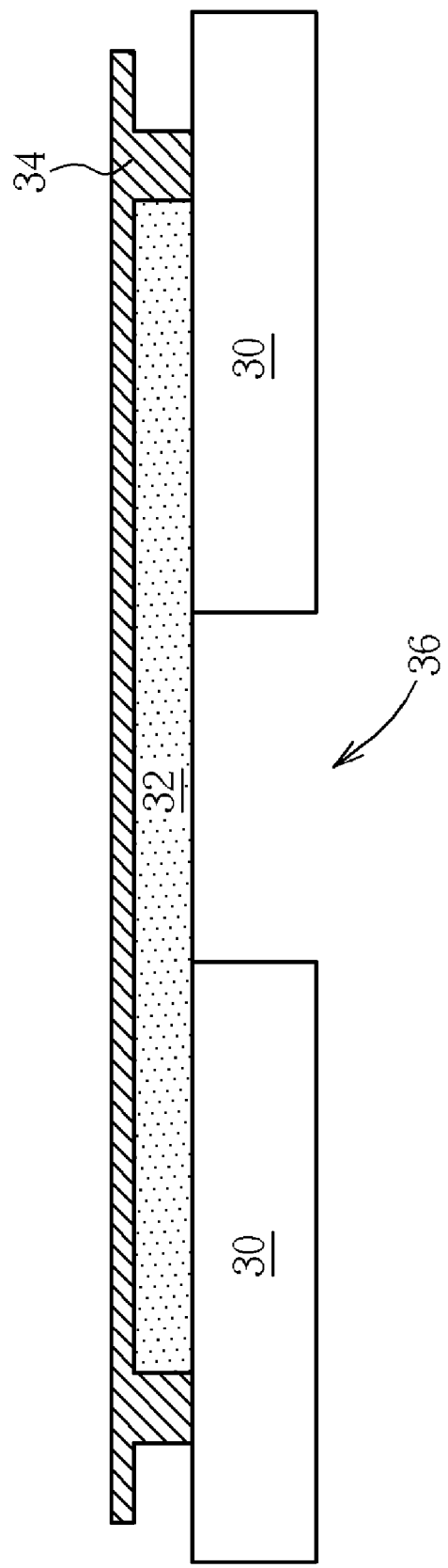
FIG. 3 through FIG. 5 illustrate a preferred embodiment of a method of fabricating a suspended structure.
Figure 4:
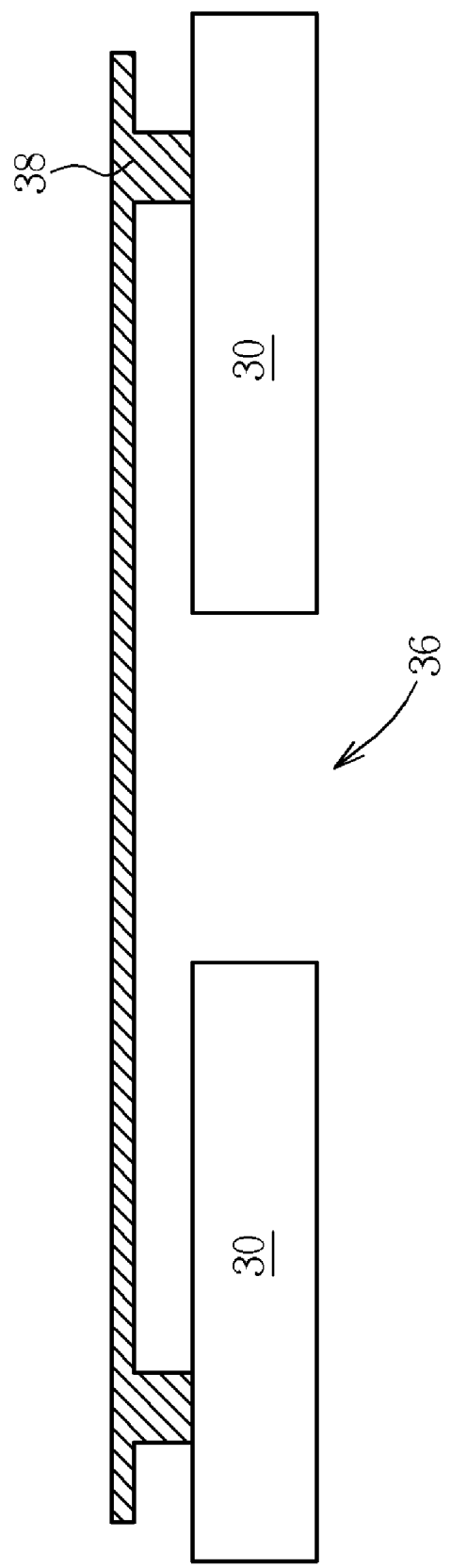
Figure 5:
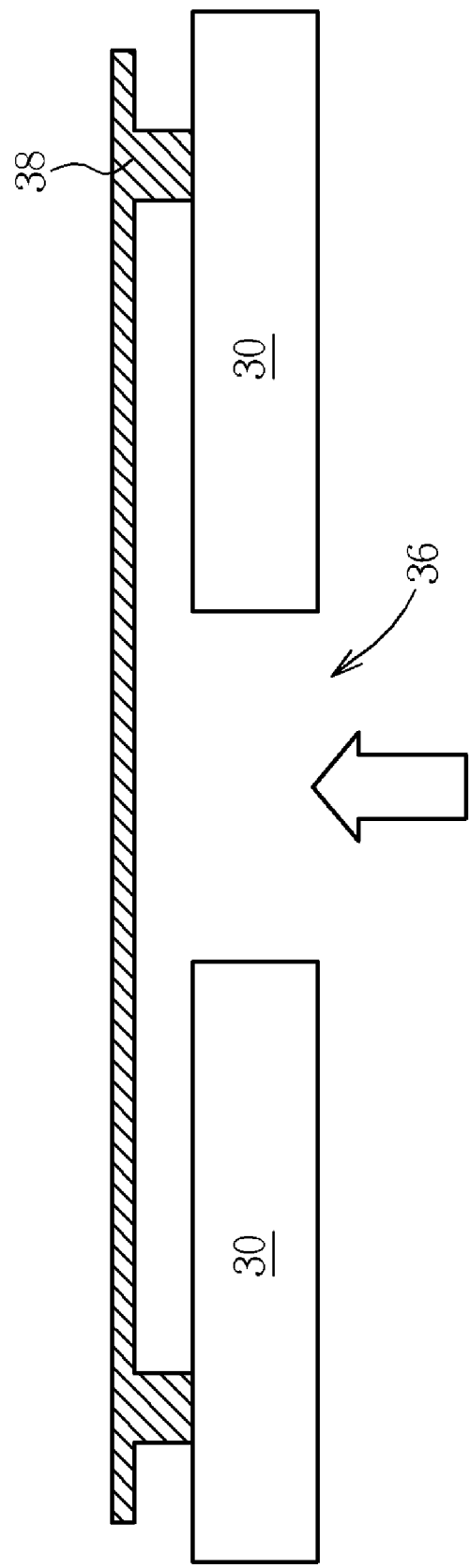

Please refer to FIG. 3 through FIG. 5. FIG. 3 through FIG. 5 illustrate a preferred embodiment of a method of fabricating a suspended structure. As shown in FIG. 3, a substrate 30 is provided at first. The substrate 30 comprises a silicon substrate or a silicon-on-insulator (SOI) substrate, but is not limited to these. The front surface of the substrate 30 has a sacrificial layer 32 with a predetermined pattern and a structural layer 34. The sacrificial layer 32 comprises silica, and the structural layer 34 comprises single-crystal silicon or polycrystalline silicon. The materials of the sacrificial layer 32 and the structural layer 34 are not limited as described, and other substances can be selected depending on requirements. Then, an opening 36 is formed on the back surface of the substrate 30 to partially expose the sacrificial layer 32.

As shown in FIG. 4, a wet etching process is performed using an etching solution to etch the sacrificial layer 32 via the opening 36 and accordingly to form a suspended structure 38. In this embodiment, because the sacrificial layer 32 comprises silica, the wet etching process uses hydrofluoric acid (HF) as the etching solution. Considering the material and the selectivity of the sacrificial layer, other solutions may be used as the etching solution. Additionally, the sacrificial layer 32 may be etched partially or completely depending on requirements.

As shown in FIG. 5, a wet cleaning process is performed using a volatile solution, such as isopropyl alcohol, ethanol, or acetone, to immerse the substrate 30 and the suspended structure 38 and consequently to remove the particles resulting from the wet etching process. Thereafter, a gas injection process is performed. The gas injection process comprises blowing an inert gas, such as nitrogen or helium, on the suspended structure 38 via the opening 36 to lift up the suspended structure 38. Therefore, the suspended structure 38 is prevented from collapsing by gravity or surface tension of the cleaning solution and from sticking to the substrate 30 and damaging the device. The parameters of flow flux and rate may be controlled to not damage the suspended structure 38. In addition, the gas injection process may be accompanied by a heating process or by a warm inert gas to increase the volatility of the cleaning solution.

It is worth noting that the gas blows onto the suspended structure directly via the opening on the back surface of the substrate in the above-mentioned embodiment. However, the gas may be blown from other directions, for instance, from the side of the suspended structure and the substrate to obtain a similar result. Moreover, the method of fabricating a suspended structure disclosed by the invention may apply to fabricating many MEMS devices including a suspended structure, such as a piezo-resistive pressure sensors, a capacitive pressure sensors, and micro-microphones.

In conclusion, the invention discloses a method of fabricating a suspended structure that is lifted up by a gas injection process to prevent from collapse and consequent sticking to the substrate. Therefore, the yield of fabrication is raised. In addition, the process time may be reduced and the throughput may be raised with coordination of the heating process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a suspended structure, comprising:
   providing a substrate comprising a sacrificial layer and a structural layer on a front surface of the substrate;
   forming an opening on a back surface of the substrate, the opening partially exposing the sacrificial layer;
   performing a wet etching process to etch the sacrificial layer and accordingly the structural layer to form a suspended structure; and
   performing a gas injection process comprising blowing a gas on the suspended structure via the opening and consequently preventing the suspended structure from sticking to the substrate.

2. The method of claim 1, wherein the gas is an inert gas.

3. The method of claim 1, further comprising a wet cleaning process before the gas injection process.

4. The method of claim 3, wherein the substrate and the suspended structure are immersed in a cleaning solution during the wet cleaning process.

5. The method of claim 4, further comprising a heating process to enhance vaporization of the cleaning solution during the cleaning process.

6. A method of fabricating a suspended structure, comprising:
   providing a substrate comprising a sacrificial layer and a structural layer on a front surface of the substrate;
   performing a wet etching process to etch the sacrificial layer and accordingly the structural layer to form a suspended structure;
   performing a wet cleaning process comprising using a cleaning solution to clean the substrate and the suspended structure; and
   performing a gas injection process comprising blowing a gas on the suspended structure and consequently preventing the suspended structure from sticking to the substrate.

7. The method of claim 6, wherein the gas is an inert gas.

8. The method of claim 6, further comprising forming an opening on a back of the substrate, and consequently the gas blows on the suspended structure via the opening to raise the suspended structure.

9. The method of claim 6, further comprising a heating process to enhance vaporization of the cleaning solution during the gas injection process.

* * * * *